United States Patent [19]
Kondo et al.

[11] Patent Number: 5,392,730
[45] Date of Patent: Feb. 28, 1995

[54] METHOD FOR DEPOSITING COMPOUND SEMICONDUCTOR CRYSTAL

[75] Inventors: Makoto Kondo; Hiroshi Sekiguchi, both of Kawasaki, Japan

[73] Assignee: Fujitsu Limited, Kawasaki, Japan

[21] Appl. No.: 115,030

[22] Filed: Sep. 2, 1993

Related U.S. Application Data

[63] Continuation of Ser. No. 858,981, May 21, 1992, Pat. No. 5,304,247.

[30] Foreign Application Priority Data

Sep. 21, 1990 [JP] Japan .................... 2-252335

[51] Int. Cl.$^6$ ............................. C30B 23/00
[52] U.S. Cl. ...................... 117/102; 117/93; 117/104; 437/133
[58] Field of Search ............... 156/612, 610, 613, 614; 437/133; 117/93, 102, 104

[56] References Cited

U.S. PATENT DOCUMENTS

| | | | |
|---|---|---|---|
| 4,066,481 | 1/1978 | Manasevit et al. | 148/174 |
| 4,368,098 | 1/1988 | Manasevit | 156/606 |
| 4,829,021 | 5/1989 | Fraas et al. | 437/81 |
| 4,980,204 | 12/1990 | Fujii et al. | 427/255.2 |
| 5,002,630 | 3/1991 | Kermani et al. | 156/610 |
| 5,138,973 | 8/1992 | Davis et al. | 118/723 |

FOREIGN PATENT DOCUMENTS

| | | |
|---|---|---|
| 0318395 | 5/1989 | European Pat. Off. |
| 58-176196 | 10/1983 | Japan |
| 60-81093 | 5/1985 | Japan |
| 1-40712 | 10/1989 | Japan |

OTHER PUBLICATIONS

*Primary Examiner*—R. Bruce Breneman
*Assistant Examiner*—Ramamohan R. Paladugu
*Attorney, Agent, or Firm*—Staas & Halsey

[57] ABSTRACT

A crystal of a compound semiconductor is deposited on a substrate using a metal organic vapor phase epitaxy within a reaction enclosure having a vertical flow of deposition gas supplied through a gas injector within the deposition enclosure. The deposition gas is supplied in a plurality of divided flow paths in which the flow rates are individually controlled. The injector comprises a plurality of gas jet ports which receive respective, plural flow paths and which are disposed in a two-dimensional array having dimensions corresponding to the two-dimensional main surface dimensions of the substrate thereby to supply a uniform flow of deposition gas over the entire two-dimensional main surface of the substrate. The method and apparatus have special application in the deposition of quaternary III—V compound semiconductor.

15 Claims, 16 Drawing Sheets

ISOCONCENTRATION - ISOTHERMAL LINES

METHOD FOR DEPOSITING COMPOUND SEMICONDUCTOR CRYSTAL

This application is a continuation of application No. 07/858,981, filed May 21, 1992, now U.S. Pat. No. 5,304,247.

TECHNICAL FIELD

The invention relates to compound semiconductors produced by using a metal organic vapor phase epitaxy (MOVPE), which is a chemical vapor deposition (CVD) process. The invention particularly relates to a method and apparatus for depositing a III—V compound semiconductor crystal.

BACKGROUND ART

Recently, as structure, properties and so forth of devices such as electronic or optical devices have become more advanced, a precise uniformity of the film thickness and composition, etc., of a semiconductor epitaxial growth film, which is a base of such a device, have been required.

Compound semiconductor crystals have hitherto been formed by a liquid epitaxial growth method, but this growth method is hard of control due to a high growth rate, and thus it has been difficult to satisfy recent, advanced requirements.

For this reason, attention is directed to an MOVPE process in which a semiconductor crystal is grown by pyrolyzing an organometallic compound and a hydride in a vapor phase, as a technique for epitaxially growing a uniform compound semiconductor crystal on a large area substrate or a plurality of substrates, for the liquid epitaxial growth process.

The furnaces of the MOVPE crystal growth are roughly classified into a horizontal CVD furnace and a vertical CVD furnace.

FIGS. 1 to 3 are illustrations showing the principal horizontal furnaces; in the drawings, 1 is a gas injector serving as an introducing port for introducing a deposition gas, 2 is a reaction tube, 3 is a substrate for deposition, 4 is a susceptor supporting the substrate 3, and 5 is a gas exhaust port.

FIG. 1 shows a typical horizontal CVD furnace.

In the horizontal furnace of this drawing, a substrate 3 is horizontally placed on a susceptor 4 installed on a reaction tube 2, and a deposition gas containing raw materials for deposition is substantially horizontally supplied to the substrate 3.

FIG. 2 shows a barrel-type furnace, as one of the horizontal CVD furnaces.

In the horizontal furnace of this drawing, a plurality of substrates 3 are placed on the side faces of a susceptor 4 provided in a reaction tube 2, and a deposition gas is supplied from above the reaction tube 2 substantially in parallel to the substrates 3. The susceptor 4 is then rotated so that variations among the crystals deposited on the substrates 3 do not occur. The individual substrates 3 are also rotated, to produce a uniform deposition on a surface of the substrate.

FIG. 3 shows a planetary-type furnace, as another of the horizontal CVD furnaces.

In the horizontal furnace of this drawing, a plurality of substrates 3 are placed on a susceptor 4 horizontally provided in a reaction tube 2, and a deposition gas introduced from above the reaction tube 2 is allowed to horizontally flow along the susceptor 4 from substantially the center of the susceptor 4, and is supplied to the substrates 3.

These horizontal furnaces are commonly used when epitaxially growing GaAs for high speed devices and AlGaAs/GaAs systems for short wavelength optical devices by an MOVPE process, as the gas flow is relatively simple and the deposition on a large area substrate or a plurality of substrates is facilitated due to the construction thereof.

Nevertheless, the horizontal furnaces have the following three major problems:

First, since a deposition gas is unidirectionally introduced along a substrate surface, the horizontal furnaces have a problem with the growth of crystals on the substrate surface, i.e., the consumption of the deposition gas, the concentration of the deposition gas becomes thin in the direction from upstream to downstream, and as a result, the crystal deposition rate on the surface of the deposition substrate is slower in the direction from upstream to downstream of the gas flow.

Second, a problem arises in that a deposition gas introduced into a horizontal furnace has a distribution in the temperature of the deposition gas on a substrate, because the gas is gradually heated on the substrate in the direction of from upstream to downstream of the gas flow. This has resulted in a distribution of the decomposition condition of the deposition gas on the substrate, as well as a distribution of the composition of the deposited crystal on the substrate.

Third, a problem arises in that, in the horizontal furnaces, a ceiling or wall of a reaction tube exists in the vicinity of a deposition substrate, and such a ceiling or wall has an effect on the deposition of the crystal on the substrate. Namely, reaction by-products are deposited on the ceiling or wall of the reaction tube during the repetition of the crystal deposition therein, which vary the degree of decomposition of the deposition gas and have an effect on the film thickness and composition of the crystal deposited on the substrate.

FIGS. 4 and 5 illustrate the above first problem, wherein FIG. 4 shows examples of isoconcentration lines of a gas on a substrate. These isoconcentration lines indicate that the deposition gas concentration becomes thinner and thinner as it flows further from upstream to downstream over the substrate.

FIG. 5 shows the effect due to the first problem of the distribution of the deposition gas concentration on a substrate, and exemplifies a distribution of a film thickness in a horizontal furnace. The abscissa axis is the distance from the upstream of the substrate, and the ordinate axis is the thickness of the deposited film. As can be seen in this drawing, the thickness of the film deposited on the substrate becomes thinner and thinner from upstream to the downstream of the substrate.

This first problem, however, can be solved by making the crystal deposition rate uniform to a certain degree by rotating the deposition substrate. In addition, the second and third problems have not appeared in the case of binary compound semiconductors and ternary compound semiconductors consisting of two group III elements and one group V element, and therefore, have not had very significant effects on the deposition of AlGaAs/GaAs system crystals.

Nevertheless, in the deposition of a quaternary compound semiconductor such as InGaAsP system crystals used for optical devices of the 1 micrometer wavelength band or AlGaInP systems used in visible light lasers, the second and third problems have a particularly significant influence.

First, the temperature distribution of a gas flow on a substrate has a significant effect on the solid phase composition of group V elements in the InGaAsP, since the thermal decomposition efficiencies of AsH3 (arsine) and PH3 (phosphine) of the group V raw materials commonly used in an MOVPE deposition of InGaAsP differ greatly depending on a temperature. Therefore, the second problem in the horizontal furnaces is fatal to the deposition of the crystal of a quaternary compound semiconductor such as InGaAsP.

FIG. 4 also represents isothermal lines on a substrate. In this case, the lines show that the deposition gas has a higher and higher temperature as it flows further from upstream to downstream over the substrate.

FIG. 6 is a graph showing an effect due to a temperature distribution of a gas flow on a deposition substrate in the deposition of an InGaAsP system crystal, and illustrates a composition distribution in a horizontal furnace. In this drawing, the abscissa axis is the distance from the upstream of the deposition substrate, and the ordinate axis is the photoluminescence (PL) wavelength of the deposited InGaAsP crystal. A PL wavelength is a wavelength of light proper to a substance generated corresponding to the band gap of the substance when irradiated by a certain light.

In the case of an InGaAsP crystal, this graph may be considered to substantially correspond to the composition ratio of As/P of group V elements, because it has been verified that In and Ga of group III elements are deposited in an approximately uniform composition. This graph shows that the crystal deposited on the substrate has a composition in which As is decreased and P is increased from upstream to downstream. (A crystal containing more As has a large PL wavelength than a crystal containing more P.)

Also, for the above third problem, it has been confirmed, by experiments, etc., that deposits on the ceiling or wall of a reaction tube have significant effects on the uniformity of the group III solid phase composition, particularly the composition of In and Ga.

From the above, it can be considered that the use of a horizontal furnace causes difficulty in obtaining a uniform deposition of a III-V compound semiconductor crystal containing In and Ga or As and P together (such as InGaAsP, AlGaInP).

On the other hand, the problems as mentioned above do not exist in vertical furnaces, in principle.

FIG. 7 shows a typical vertical CVD furnace, wherein the same items as in FIG. 1 are designated by the same numerical signs.

In this vertical furnace, a substrate 3 is mounted on a susceptor 4 horizontally provided in a reaction tube 2, and a deposition gas introduced from a gas injector 1 provided above the reaction tube 2 is vertically supplied to the surface of the substrate 3.

A deposition gas is horizontally supplied to a substrate in the case of a horizontal furnace, but in a vertical furnace, since a deposition gas is vertically supplied to a substrate, the above mentioned first and second problems do not occur, in principle, if an ideal gas flow is realized. The third problem also does not occur because of the construction of the furnace, as no ceiling or wall of a reaction tube exists in the vicinity of the surface of a substrate.

In vertical furnaces, it is ideal to supply a gas having an equal concentration to the entire surface of a deposition substrate at an equal rate. Since the entire surface of the substrate can be in the same condition if this condition is satisfied, a crystal having a uniform film thickness and a uniform composition can be deposited on the substrate.

In general, however, it is extremely difficult to bring the diameter of a gas injector (commonly less then 1 centimeter) close to the diameter of a substrate (generally 5 to 8 centimeters), and if this is achieved, it is difficult to supply a deposition gas having a uniform concentration from a gas injector with a large diameter. In practice, a gas injector having a smaller diameter than the diameter of a substrate therefore must be provided above the center of the substrate. Consequently, the deposition gas introduced from the gas injector is concentrated at the central portion of the substrate, as shown in FIG. 7.

FIG. 8 illustrates the isoconcentration and isothermal lines of a gas on a substrate in a prior vertical furnace. In this drawing, the nearer the lines approach the substrate, the lower the concentration and the higher the temperature.

It has been found that the isoconcentration and isothermal lines vary greatly at the center of the substrate, as shown in the drawing, since the deposition gas is concentrated at the central portion of the substrate, as aforementioned.

FIG. 9 is a graph illustrating a film thickness distribution of an InGaAsP crystal deposited on a substrate in a prior vertical furnace. As a consequence of the large variation of gas concentration near the center above a substrate as shown in FIG. 8, the film thickness of a crystal deposited on the substrate has a distribution which becomes maximum near the center.

Similarly, FIG. 10 is a graph illustrating a composition distribution of an InGaAsP crystal deposited on a substrate in a conventional vertical furnace. Again, in this drawing, the As/P composition ratio can be determined by detecting a PL wavelength in the face of a substrate, as in FIG. 6. It is found that the crystal deposited on the substrate has a composition distribution with large variations, as a consequence of the large variation of gas temperatures near the center above the substrate.

Furthermore, in the vertical furnaces, a convection of a deposition gas occurs in a reaction tube as shown in FIG. 7, since the concentrated deposition gas is supplied to the central portion of a substrate as aforementioned. Therefore, the uniformity of the film thickness or composition of a crystal deposited on the substrate is subjected to variations due to the convection as well.

When a heterojunction, for example, is formed on a substrate, the abruptness of the heterointerface is adversely affected.

To improve the concentration of a deposition gas at the center of a substrate, as described above, the flow rate control technique may be used as proposed by the inventors in Japanese Unexamined Patent Publication No. 1-140712. In this technique, a plurality of sub-injectors are provided in such a manner that they face a substrate and are arranged along a centerline in the substrate plane, and a gas controlled at a given flow rate is supplied from each sub-injector toward the surface of the substrate being rotated.

Using this technique, both a film thickness and a composition can have an improved uniformity, as far as the deposition of crystal of a binary compound semiconductor such as GaAs or a ternary compound semiconductor such as GaInAs is concerned, but when this technique is applied to the deposition of crystal of a quaternary compound semiconductor such as InGaAsP, the uniformity of the film thickness is good, but no improvement is found in the uniformity of the composition (particularly, the uniformity of the composition for As and P of group V elements in the deposited crystal), because in this case, only a part of the substrate is vertically supplied with a deposition gas directly from sub-injectors arranged along a centerline in the substrate.

That is, with the technique described in Japanese Unexamined Patent Publication No. 1-140712, since the deposition gas supplied from sub-injectors strikes vertically against the portion of a substrate directly below the sub-injectors, and then the flow direction is laterally turned and flows along the surface of the substrate and toward the edge thereof, the gas is heated in the direction from upstream to downstream of the lateral flow, leading to the distribution of the gas temperature on the substrate. Accordingly, although this technique was useful for supplying a deposition gas in an even concentration onto a substrate, it is still insufficient for making the temperature distribution of the gas flow as uniform as possible to hold a constant ratio of deposition rate among group V elements.

DISCLOSURE OF THE INVENTION

The invention aims to provide an MOVPE method and apparatus by which a compound semiconductor crystal having a uniform film thickness and composition can be deposited on the entire surface of a substrate.

The method of depositing a compound semiconductor crystal of the invention, in which a deposition gas containing two or more material gases is supplied to a reaction chamber, and the material gases are pyrolyzed to thereby deposit a compound semiconductor crystal on a substrate placed in the reaction chamber, is characterized by dividing the stream of the deposition gas supplied to the reaction chamber into a plurality of streams, individually adjusting the flow rates of the divided streams, and vertically supplying the respective divided streams having the adjusted flow rate to the entire surface of the substrate through jet ports arranged in such a manner that they cover the entire surface of the substrate on which the crystal is to be deposited.

According to the invention, since a deposition gas is thus vertically supplied to the entire surface of a substrate as divided streams and at respective adjusted flow rates, ideal isoconcentration lines and isothermal lines, which are parallel to the substrate surface, can be realized.

Thus, the rotation of a substrate conventionally adopted in the prior art, in which only a part of the substrate surface is straightly and vertically supplied with a deposition gas is unnecessary in the present invention in principle, as the isoconcentration lines and the isothermal lines of the deposition gas are parallel to the entire substrate surface. In practice, by rotating a substrate, the distortion of isoconcentration and isothermal lines may be compensated, which results from factors in an apparatus, for example, a variance among individual jet ports supplying the individual divided gas streams, and a variance among individual flowmeters controlling the flow rate of the divided stream. In this case, the rotation of the substrate may be slower than in the conventional case.

The method of deposition of a compound semiconductor of the invention can be carried out by means of an apparatus for depositing a compound semiconductor crystal, comprising (a) a gas supply system supplying a deposition gas containing two or more material gases for forming a crystal of a compound semiconductor to a reaction chamber, (b) a reaction system consisting of a reacting enclosure for defining the extent of the reaction chamber and depositing the crystal of the compound semiconductor therewithin, a susceptor provided in the reacting enclosure, mounting a substrate on which the compound semiconductor crystal is to be deposited, a gas injector for vertically supplying the deposition gas to the substrate on the susceptor, provided at the top of the reaction enclosure and facing the susceptor, and a means for heating the substrate, and (c) a gas exhaust system for exhausting the spent deposition gas containing a by-product of a pyrolysis reaction of the material gases in the reaction chamber to the outside of the reaction enclosure, the apparatus being characterized in that the gas supply system has a plurality of divided flow paths for the deposition gas, and control means are provided in each of the divided flow paths for individually adjusting the flow rates of the deposition gas, the gas injector in the reaction system consists of a plurality of sub-injectors densely aggregated in such a manner that they cover the entire surface of the substrate placed on the susceptor, and the respective flow paths of deposition gas individually controlling the flow rate thereof are connected to the respective sub-injectors one by one.

In a preferred embodiment of the invention, the gas injector is composed by a sub-injector centrally provided, and a group of sub-injectors provided around the central sub-injector.

The sub-injector may be a tube of an appropriate size, and those having a sectional shape of circle, square, regular hexagon or the like may conveniently used, provided that a gas is uniformly blown up. If tubes are used, which can be densely bundled without a gap, such as square or regular hexagonal tubes, the flow area of gas can be increased to thereby reduce the gas residence sections. In this case, when the end of each of the sub-injectors is obliquely spread out, the gas residence sections are more effectively eliminated.

The sub-injectors may be made, for example, of a metal (stainless steel or the like) or quartz. To obliquely spread out the end of the injector as described above, for example, machining may be used when the material is a metal, and etching may be utilized when the material is quartz.

To realize isoconcentration-isothermal lines substantially parallel to the surface of a substrate, it is advantageous to axially, symmetrically arrange the sub-injectors forming a gas injector. Moreover, preferably the gas injector is formed of groups of sub-injectors arranged in such a manner that they cover the entire surface of the substrate, by separating the groups into at least two areas at the center and at the outside adjacent thereto, more preferably the gas injector is formed of groups of sub-injectors disposed in such a manner that they cover the entire surface of the substrate, by separating the gas injector into at least three areas of the center, the outside end, and a point intermediately therebetween, although this also depends on the size of the substrate.

Thus, the size and number of sub-injectors required are determined depending on the size of the substrate and the constitution of the gas injector. For example, when using circular section tubes for a 2 inch substrate, to cover the entire surface of the substrate by separating it into three areas of the center, the outside end, and intermediately therebetween, a sub-injector can be placed at the center, six sub-injectors disposed therearound, and further twelve sub-injectors disposed around the six sub-injectors; the outer diameter of each sub-injector may be on the order of 10 millimeters. When using regular-hexagonal sub-injectors and triply arranging 19 sub-injectors as in the above example, sub-injectors having a side length of a hexagon of about 7 millimeters may be used for a 2 inch substrate, and sub-injectors having a side length of about 10 millimeters used for a 3 inch substrate, for example.

Generally, sub-injectors having too large a size make the realization of the isoconcentration-isothermal lines referred to above more difficult, whereas a reduction of the size leads only to an increase of the numbers of the divided streams and the flow rate control means thereby complicates the apparatus. Concerning sub-injectors with a circular section, it is common to use those having a diameter of 10 to 20 millimeters, with those having a diameter of 10 to 16 millimeters being preferably used. For regular-hexagonal sub-injectors, it is common to use those having a side length of 5 to 15 millimeters.

The flow rate control means in the gas supply system independently controls the deposition gas flow rate in each divided flow path, but it is preferable to adjust the flow rates of deposition gas in the respective control means in such a manner that, for each of three areas of the center, the end, and intermediately therebetween, the flow rates supplied from the respective sub-injectors are constant. Concerning the flow rates of the respective sub-injectors in the three areas, although crystals having a further improved uniformity in both film thickness and composition than those of conventional crystals have been obtained at the same flow rate for all of the sub-injectors, by the inventors experiments, it would be useful for the improvement of uniformity at the end area to make the flow rate of the deposition gas in the sub-injector of the end area slightly more than that of the inner areas. Thus, the ratio of the flow rates to be distributed to respective divided flow paths should be determined depending on the apparatus and deposition gas used, the deposition conditions and the like, for a crystal having a uniform film thickness and composition to be obtained in a substrate.

The divided flow paths in the gas supply system may be further divided downstream of the flow rate control means, and these subdivided flow paths may be connected to the separate sub-injectors one by one. In this case, the subdivided flow paths divided from the same divided flow path should be connected to the sub-injectors of the same area to which the deposition gas be supplied therethrough.

In the gas supply system, a manifold may be provided for mixing material gases and a carrier gas, to prepare a deposition gas; and the flow path of the deposition gas supplied from the manifold can be divided, and the gas flow rates of the respective divided flow paths can be independently controlled by means of a mass flow controller provided in the respective flow paths.

The method and apparatus of the invention are particularly suitable for the depositing of a crystal of a compound semiconductor containing two or more group V elements, the composition ratio of which is particularly susceptible to the temperature distribution of decomposition gas on a substrate, such as InGaAsP, because, according to the method and apparatus of the invention, not only isoconcentration lines parallel to the surface of the substrate on which the crystal is to be deposited but also isothermal lines also parallel thereto can be realized on the substrate.

The number of substrate on which a crystal of a compound semiconductor is to be deposited in the method and apparatus of the invention can be more than one, and may, of course, be two or more.

The other objects and advantages of the present invention will be self-evident from the following description made with reference to the attached drawings.

BEST MODE OF CARRYING OUT THE INVENTION

Figure 1:
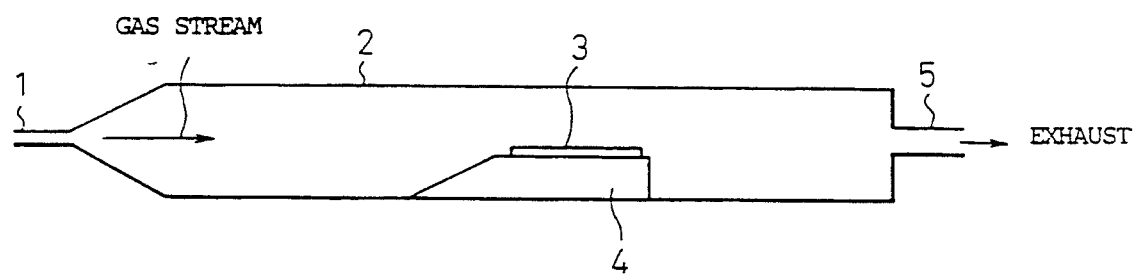
FIG. 1 is an illustration of a typical prior horizontal CVD furnace.
Figure 2:
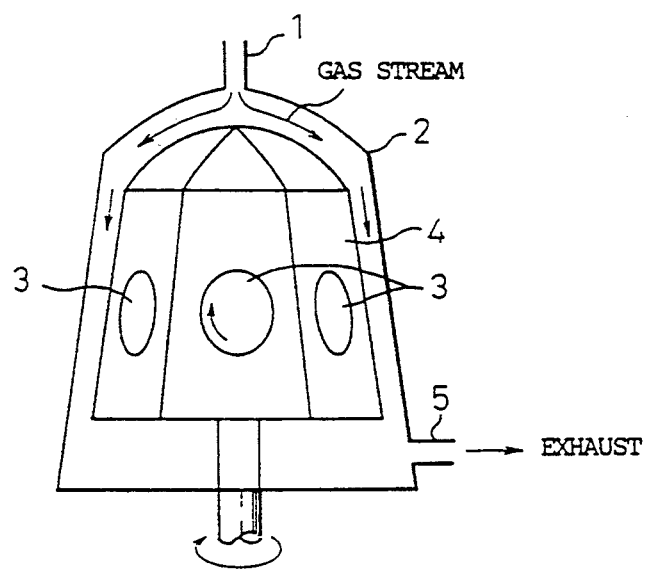
FIG. 2 is an illustration of a prior barrel-type furnace.
Figure 3:
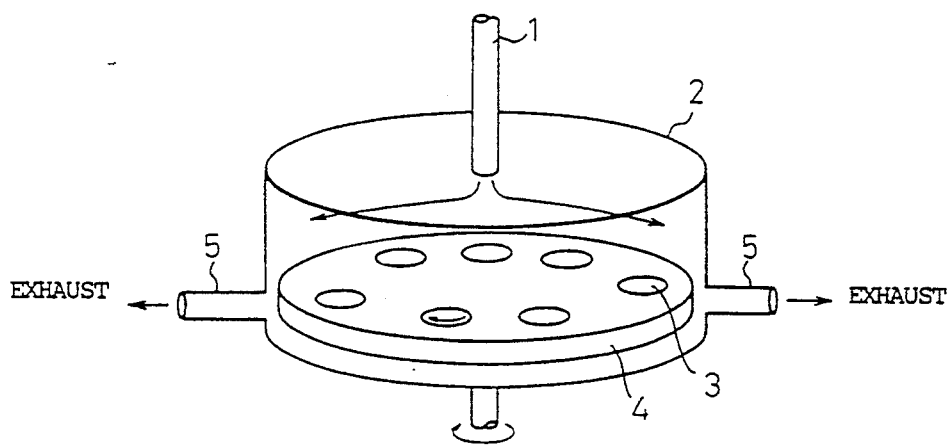
FIG. 3 is an illustration of a prior planetary-type furnace.
Figure 4:
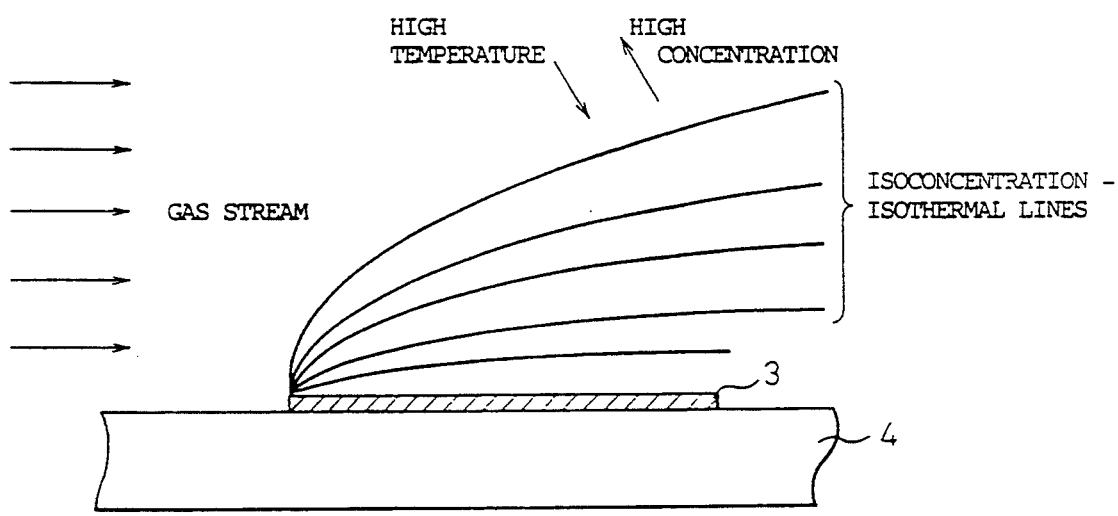
FIG. 4 is an illustration showing examples of isoconcentration and isothermal lines in a horizontal furnace.
Figure 5:
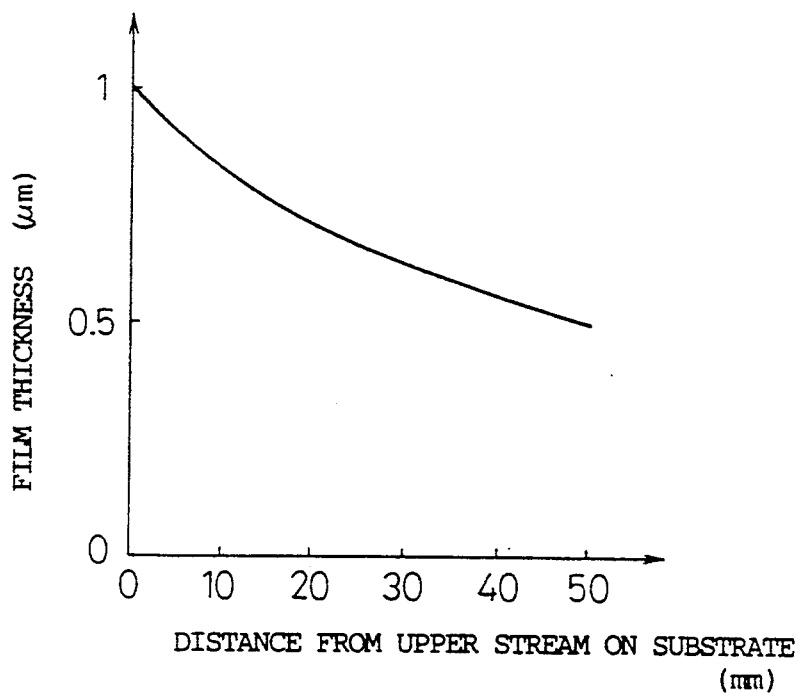
FIG. 5 is a graph illustrating a film thickness distribution in a horizontal furnace.
Figure 6:
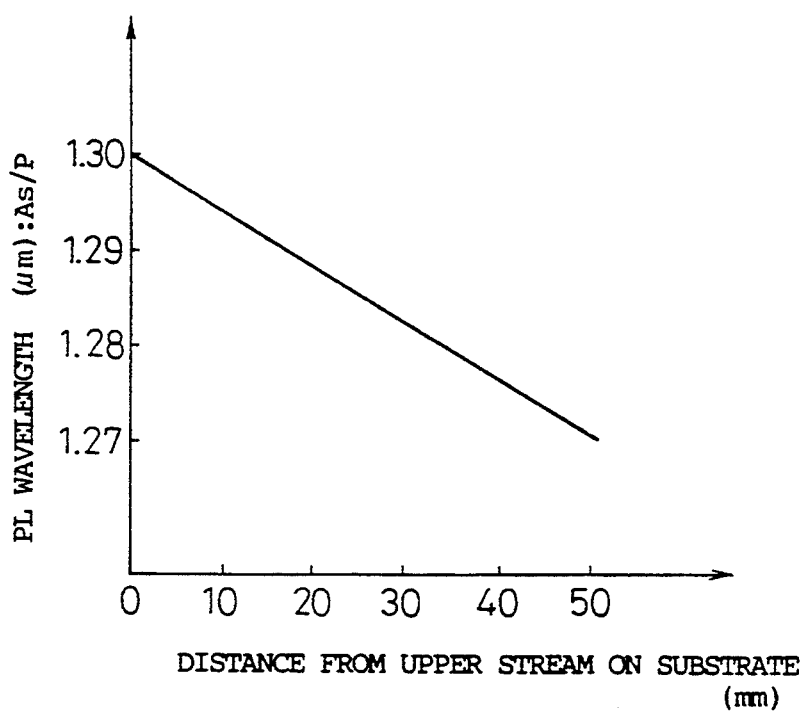
FIG. 6 is a graph showing a composition distribution in a horizontal furnace.
Figure 7:
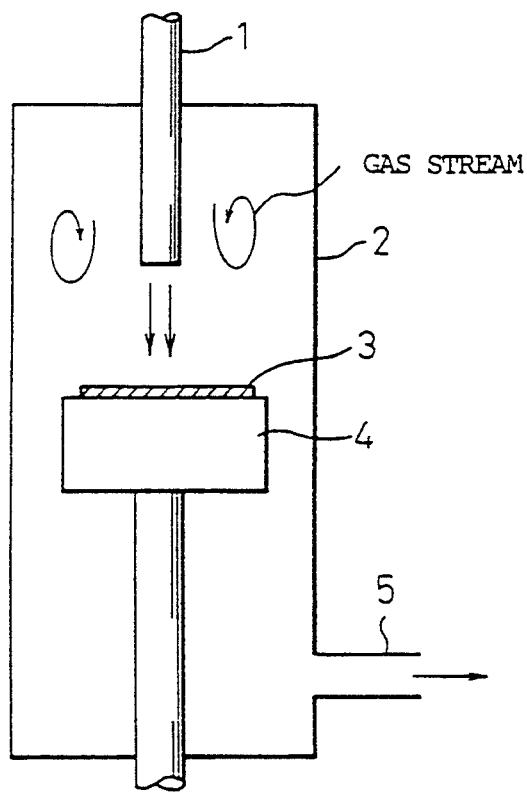
FIG. 7 is an illustration of a typical prior vertical CVD furnace.
Figure 8:
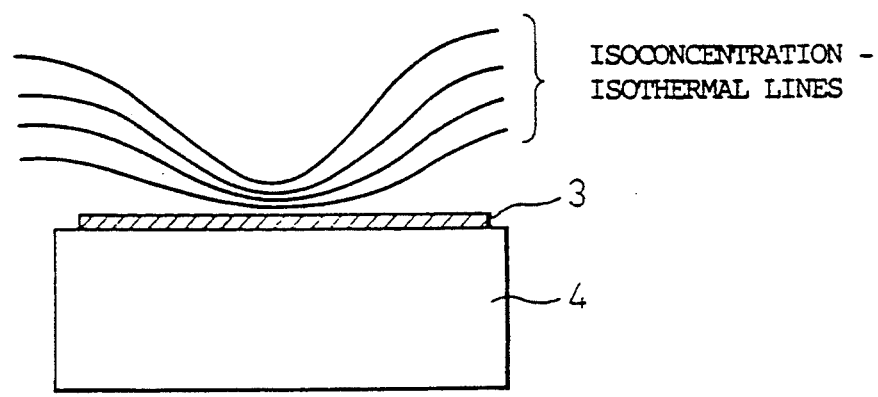
FIG. 8 is an illustration showing examples of isoconcentration and isothermal lines in a prior vertical furnace.
Figure 9:
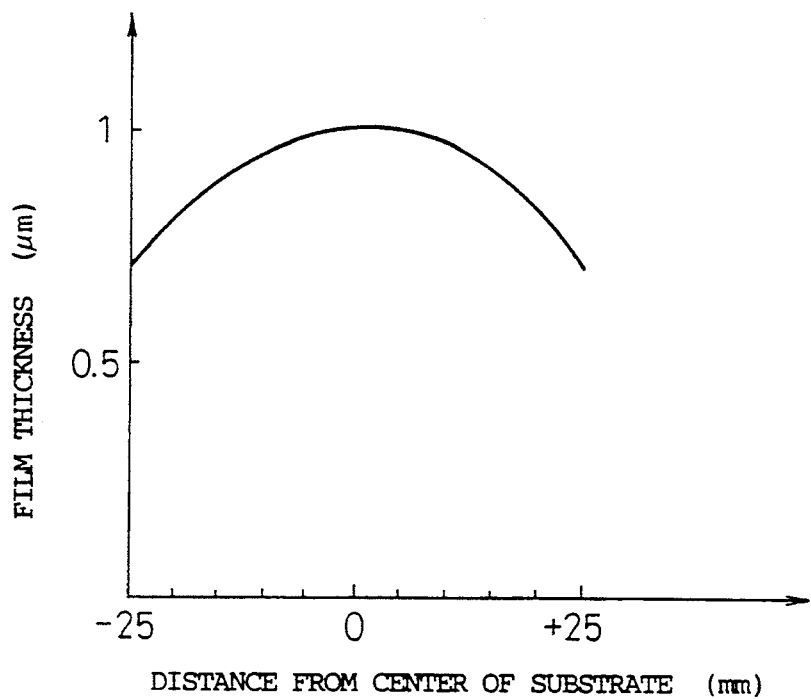
FIG. 9 is a graph illustrating a film thickness distribution in a prior vertical furnace.
Figure 10:
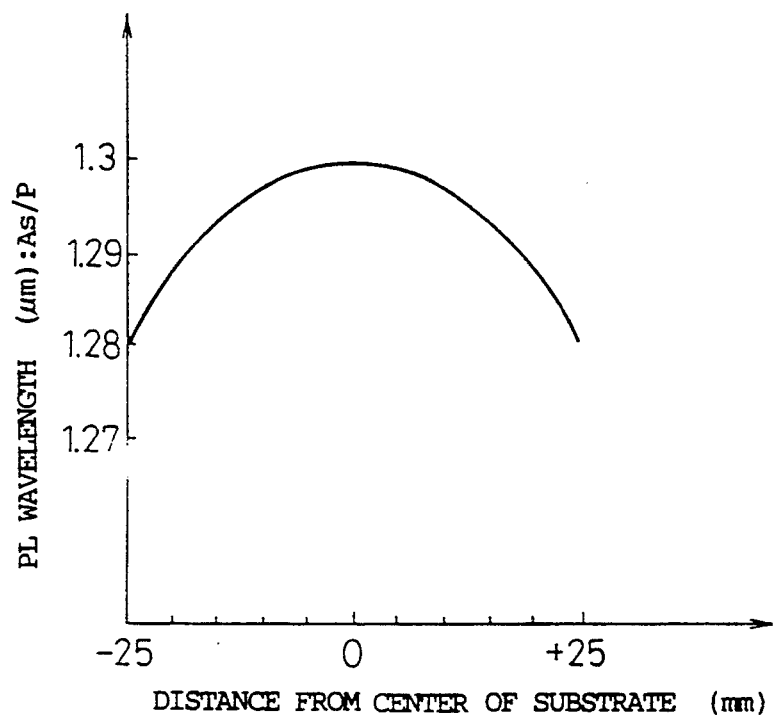
FIG. 10 is a graph illustrating a composition distribution in a prior vertical furnace.
Figure 11:
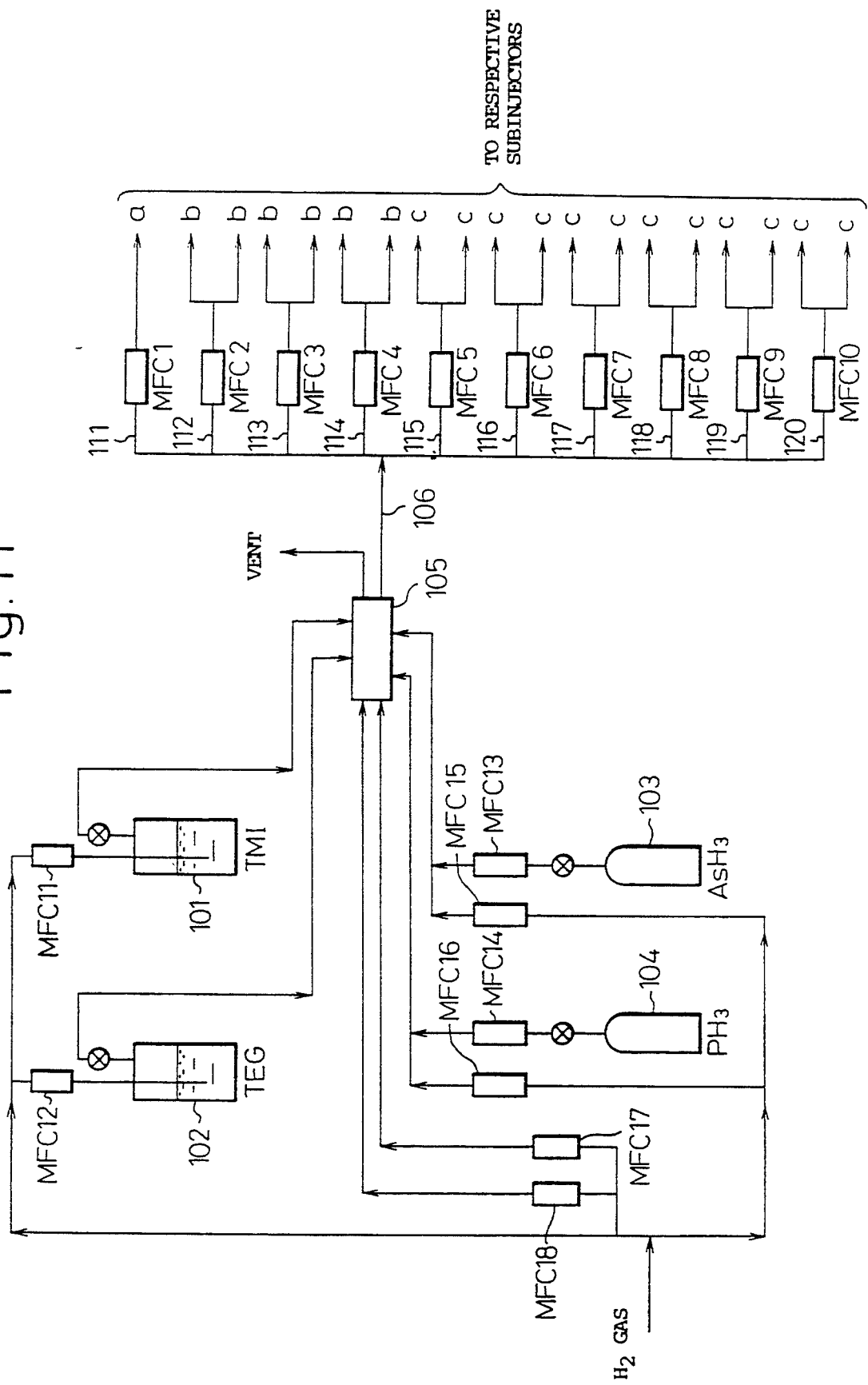
FIG. 11 is an illustration of a gas supply system in an apparatus of the invention.
Figure 12:
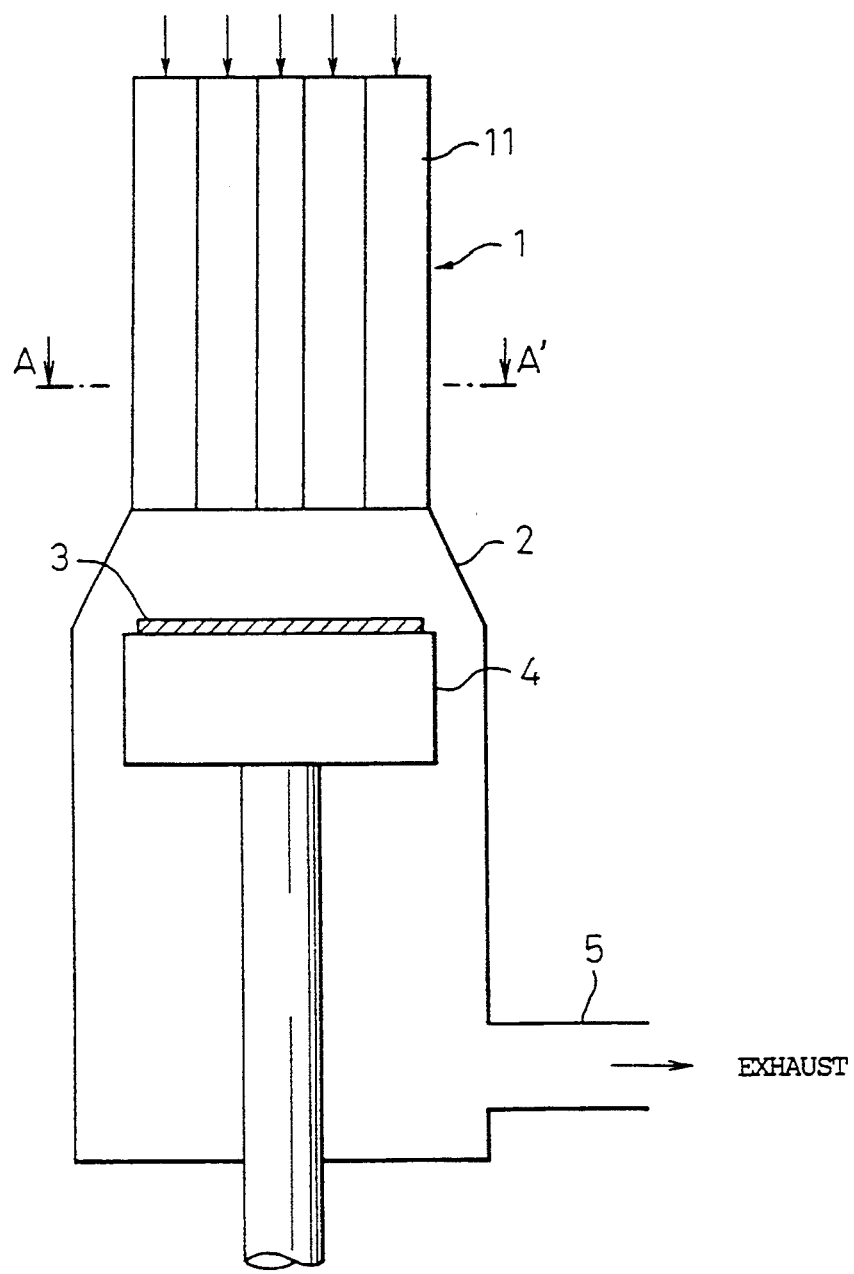
FIG. 12 is an illustration of a reaction system in an apparatus of the invention.

FIGS. 11 and 12 schematically show a gas supply system and a reaction system in an apparatus for carrying out the method of the invention, respectively. In FIG. 12, the same items as in FIG. 1 are designated by the same numerical signs.

Although only the gas sources of trimethylindium (TMI, In(CH$_3$)$_3$), triethylgallium (TEG, Ga(C$_2$H$_5$)$_3$), phosphine (PH$_3$), and arsine (ASH$_3$), which are raw materials for depositing a crystal of a quaternary compound semiconductor, InGaAsP, are illustrated in the gas supply system of FIG. 11, it is understood that other gas sources required when forming, for example, a heterojunction, have been omitted. In this drawing, the TMI and TEG of organometallic raw material gases are transported to a manifold 105 together with hydrogen of a carrier gas supplied to respective bubblers 101 and 102, the flow rates of which are separately controlled by mass flow controllers MFC11 and MFC12. Arsine and phosphine are transported from respective bombs 103 and 104 to the manifold 105, the flow rates thereof being respectively controlled by mass flow controllers MFC13 and MFC14, and respectively combined with hydrogen gas, the flow rate of which is also controlled by an MFC15 or MFC16. Hydrogen of a diluting gas is also supplied to the manifold 105, the flow rate of which is controlled by MFC17 and MFC18.

Figure 13:
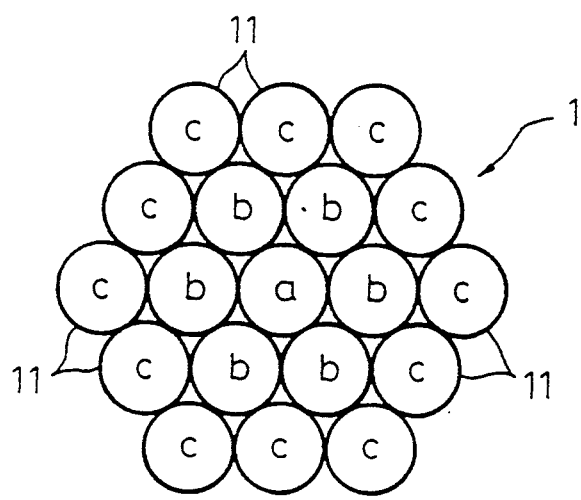
FIG. 13 is a cross section taken along the line A—A' in FIG. 12.

The deposition gas mixed in the manifold 105 is divided from the flow path 106 into ten divided flow paths 111 to 120, and the flow rates of these flow paths are controlled by respective mass flow controllers MFC1 to MFC10. In the drawing, the flow paths down MFC2 to MFC10 are subdivided into two flow paths each, and by way of the thus flow-controlled and divided 19 flow paths, the deposition gas is supplied to each of the sub-injectors composing the gas injector of a reaction system. The symbols a, b, and c given at the right of the 19 divided flow paths in this drawing correspond to the symbols a, b, and c for sub-injectors later described in FIG. 13.

A reaction system of the invention shown in FIG. 12 is formed of a reaction enclosure 2, a gas injector 1 provided at the top of the enclosure, a susceptor 4 on which a substrate for depositing a crystal is mounted, and a gas exhaust port 5.

A means of heating the substrate 3 is provided in the reaction system, although not shown in the drawing. The heating means may be a heater provided in the susceptor 4 or a radio-frequency heating coil provided outside the reaction enclosure 2, as in conventional apparatuses.

The gas injector 1 is formed by densely aggregating a plurality of sub-injectors 11, for example, by a central sub-injector a, a group of sub-injectors b surrounding said sub-injector a, and a group of sub-injectors c located further outside and surrounding the group of sub-injectors b, in such a manner that the gas injector 1 covers the entire surface of the substrate 3 on the susceptor 4, and vertically supplies the deposition gas from the sub-injectors to the entire surface of the substrate.

Figure 14:
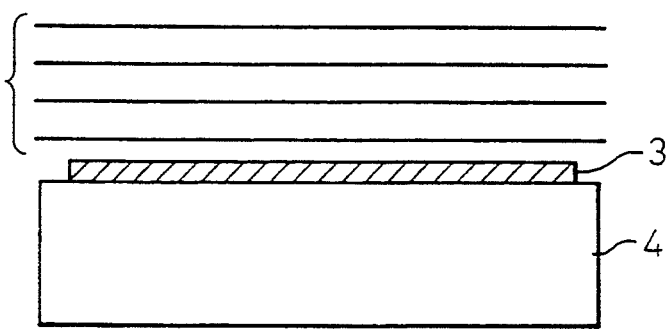
FIG. 14 is an illustration of isoconcentration and isothermal lines on a substrate in the invention.

By vertically supplying the deposition gas of each flow path divided and flow-controlled in the gas supply system, from the sub-injectors 11 thus formed, to the entire surface of the substrate 3, isoconcentration-isothermal lines can be realized which are parallel to the substrate surface, as schematically shown in FIG. 14. This phenomenon, i.e., that isoconcentration-isothermal lines parallel to a surface of heated planar substrate can be realized by adequately controlling the velocity of each flow line constituting a mixed gas flow supplied onto the substrate, is mathematically proven in Hermann Schlichting, "Boundary-Layer Theory", McGrow-Hill Publishing Company, New York (1968). In FIG. 14, the closer the lines to the substrate, the lower the concentration and the higher the temperature.

The gas flow rate to be introduced into each sub-injector for obtaining isoconcentration-isothermal lines parallel to a substrate surface should be optimized depending on conditions such as the shape and size of a reaction enclosure, and deposition conditions of a crystal. When the gas flow rate is controlled, the most realistic method is that in which each of the flow rates for the sub-injector a, group of sub-injectors b, and group of sub-injectors c is separately controlled.

Figure 15:
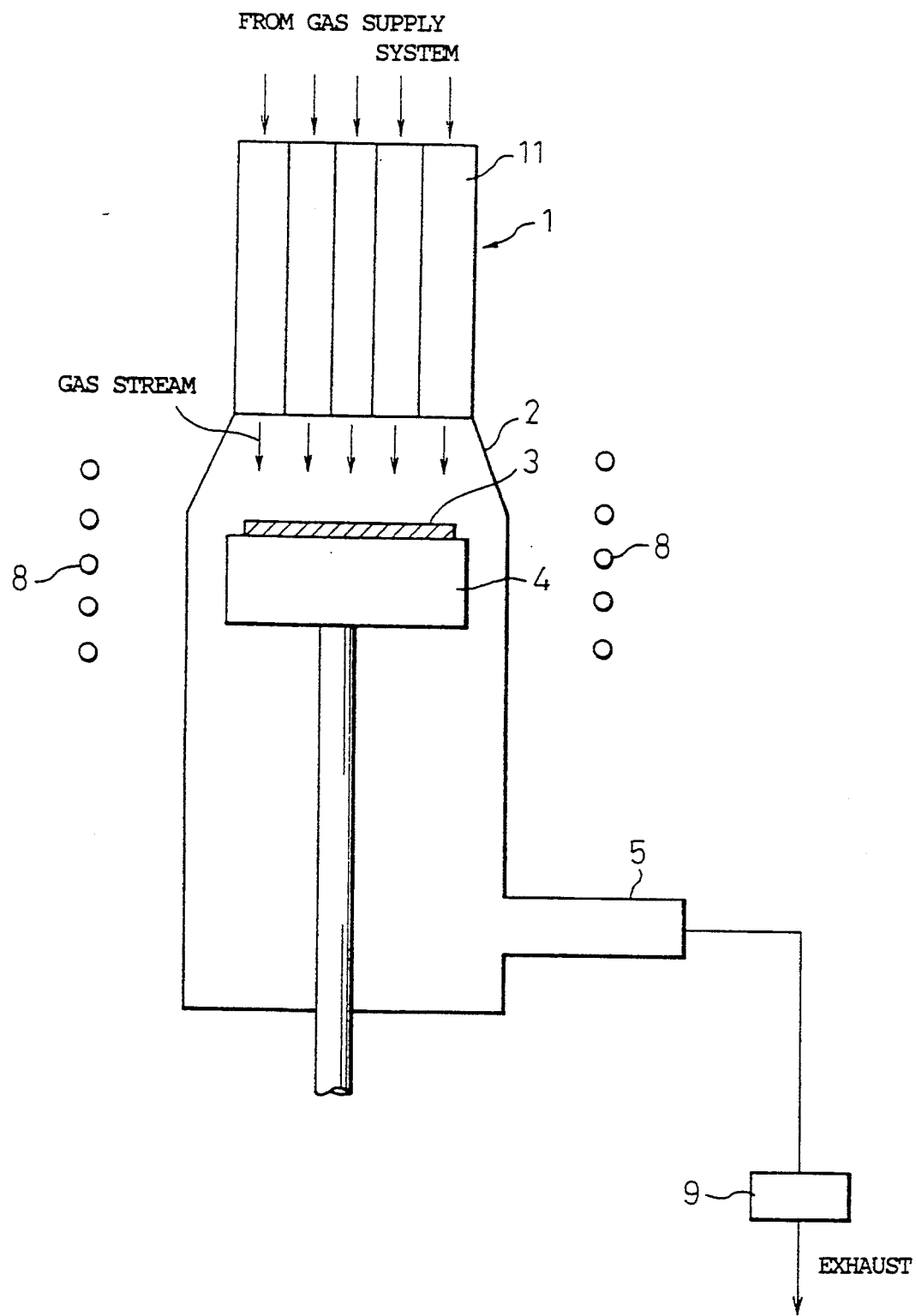
FIG. 15 is a schematic view of the deposition device in an embodiment of the invention.
Figure 16:
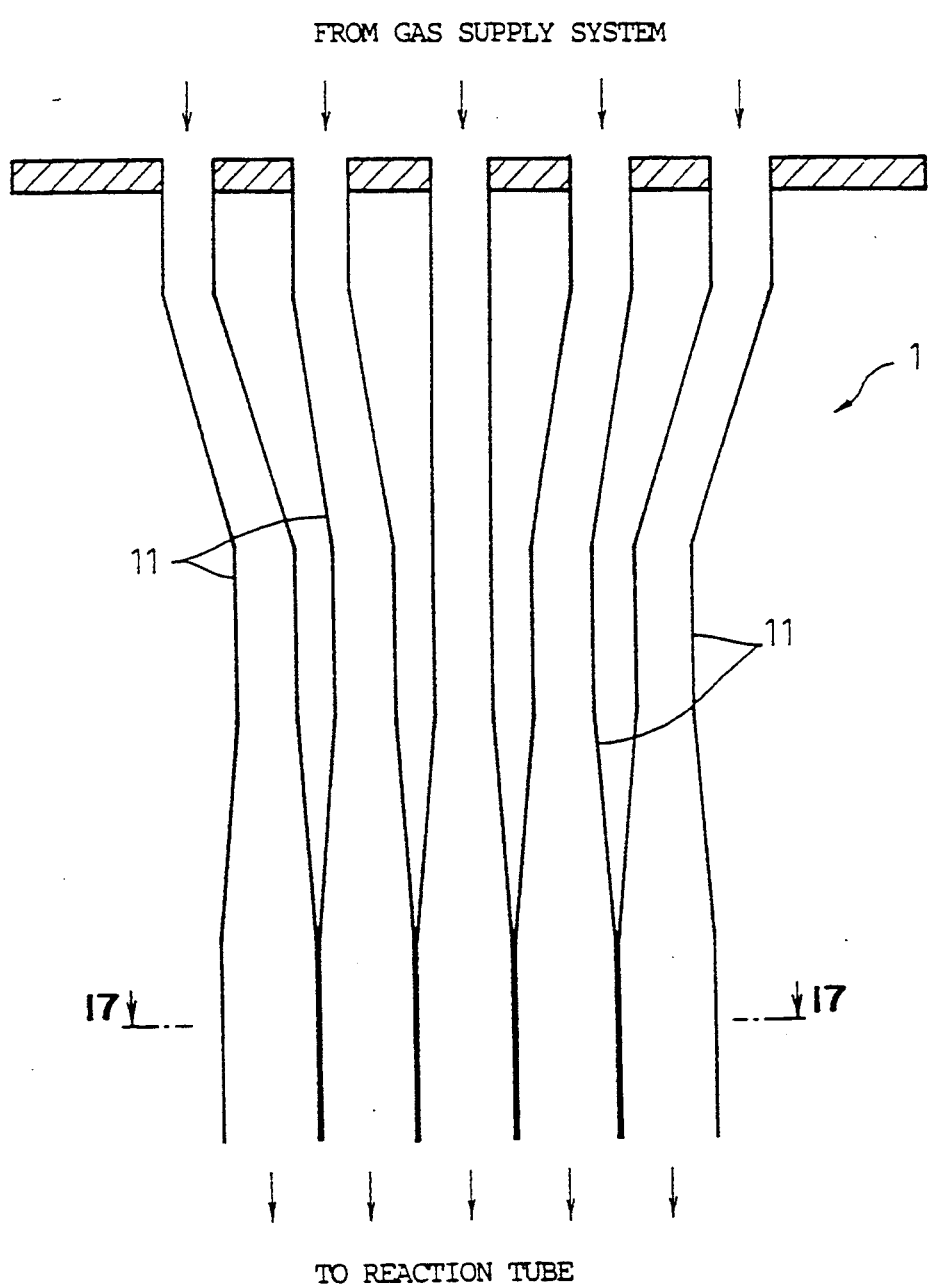
FIG. 16 is a cross section of the gas injector in an embodiment of the invention.

FIG. 15 is a schematic view of reaction and gas exhaust systems of a deposition apparatus in an embodiment of the invention. FIG. 16 is a enlarged sectional view of a gas injector in this embodiment, and FIG. 17 is a sectional view taken along the line A—A' in FIG. 16.

In FIG. 15, a gas injector made of quartz is designated by 1, and consists of sub-injectors 11 connected to respective divided flow paths in a gas supply system. In the drawing, 2 is a reaction tube, also made of quartz, 3 is a substrate on which a crystal is to be deposited, 4 is a susceptor made of carbon, for supporting the substrate 3, 5 is a gas exhaust port, 8 is a radio-frequency heating coil for indirectly heating the substrate 3 on the susceptor 4 by heating said susceptor 4, and a is a rotary pump for creating a vacuum in the reaction tube 2.

The vertical section of the gas injector 1 in this embodiment has a constitution such as shown in FIG. 16. The length from the inlet connected to a gas supply system to the outlet connected to the reaction tube 2 is, for example, about 150 millimeters, and the distance between the respective sub-injectors 11 is about 30 millimeters near the inlet and about 2 millimeters near the outlet.

Figure 17:
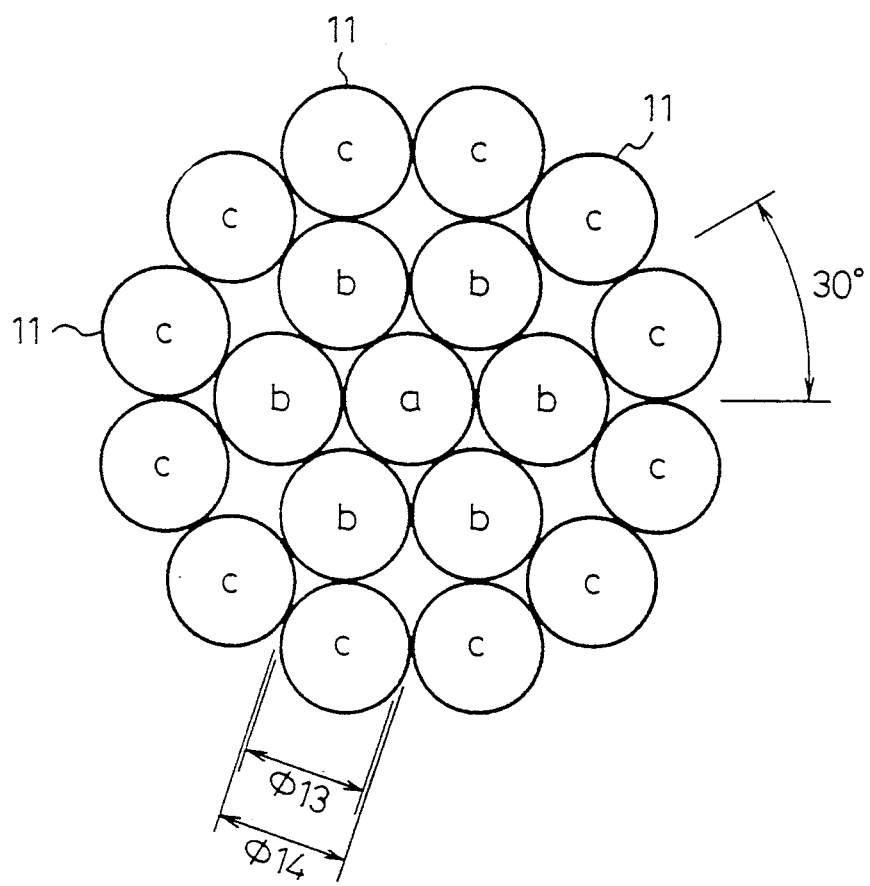
FIG. 17 is a cross section taken along the line A—A' in FIG. 16.

The A—A' section in FIG. 16 has a form such as shown in FIG. 17. In this embodiment, 19 sub-injectors 11 having a circular section are provided in such a manner that they cover the entire surface of the substrate 3. The structure in this drawing is formed by a central sub-injector a, a group of sub-injectors b surrounding the sub-injector a, and a group of sub-injectors c further surrounding the group of sub-injectors b. The sub-injectors c in the outermost group are placed, for example, by taking a center angle of 30 degrees for the sub-injector a as center; the individual sub-injectors 11 have an inner diameter of, e.g., 13 millimeters, and an outer diameter of 14 millimeters.

Furthermore, the inner diameter of the sub-injector 11 may be varied according to the size of the substrate 3. When a deposition is made for a plurality of substrates 3, the number of sub-injectors 11 may be increased depending on the area of the susceptor 4 on which the substrates 3 are mounted, to thereby enlarge the gas injector 1.

The gas supply system in this embodiment is as shown in FIG. 11. The material gases of trimethylindium, triethylgallium, arsine and phosphine are transported to a manifold 105 together with hydrogen of a carrier gas, and mixed with hydrogen of a carrier gas therein to thereby form a deposition gas. The deposition gas passes through a flow path 106, and is divided into ten flow paths 111 to 120, the flow rates thereof being separately controlled by mass flow controllers MFC1-10 in the respective divided flow paths.

A crystal of InGaAsP of a quaternary III—V compound semiconductor is formed from said materials, and when arsine of these four materials is replaced by, e.g., trimethylaluminum of an organic aluminum compound, a crystal of AlGaInP of a different quaternary III—V compound semiconductor can be obtained.

As is obvious from this drawing, in the present embodiment, each of the MFC2-10 controls the gas flow rate supplied to two of the sub-injectors 11. Although all of the sub-injectors 11 may be, of course, controlled by separate mass flow controllers, 19 mass flow controllers will then be required for 19 sub-injectors 11. In contrast, the present embodiment can be carried out by only 10 mass flow controllers, but even in this case, the groups of sub-injectors a, b, and c are preferably independently controlled.

In the present embodiment, the deposition of crystal on a substrate is carried out as follows:

Raw material gases and a carrier gas are first mixed in a manifold 105 to prepare a deposition gas. The flow of this deposition gas is divided and supplied to 10 mass flow controllers MFC1-10. The gas flows controlled at given flow rates by the respective mass flow controllers are supplied to 19 sub-injectors 11. At this time, for example, the flow path downstream of the MFC1 is connected to a sub-injector a, the flow paths downstream of the MFC2-4 are divided into two and connected to a group of sub-injectors b, and the flow paths downstream of the MFC5-10 are also divided into two and connected to a group of sub-injectors c. The gas flow supplied to each sub-injector 11 is vertically supplied to the surface of a substrate 3 mounted on a susceptor 4, and as a result, the deposition gas having a uniform concentration and a uniform temperature can be supplied to the entire surface on the substrate 3.

The results obtained in the embodiment are shown below. The deposition conditions were as follows:

| | |
|---|---|
| deposition substrate: | InP |
| deposited layer: | InGaAsP |
| deposition temperature: | 570° C. |
| pressure: | 50 torr |
| total gas flow rate: | 8 liter/min. |
| gas flow velocity: | about 2 m/s |
| deposition rate: | 1 μm/h |
| raw materials for deposition: | trimethylindium (TMI) |
| | triethylgallium (TEG) |
| | arsine (AsH$_3$) |
| | phosphine (PH$_3$) |
| carrier gas: | hydrogen (H$_2$) |

Figure 18:
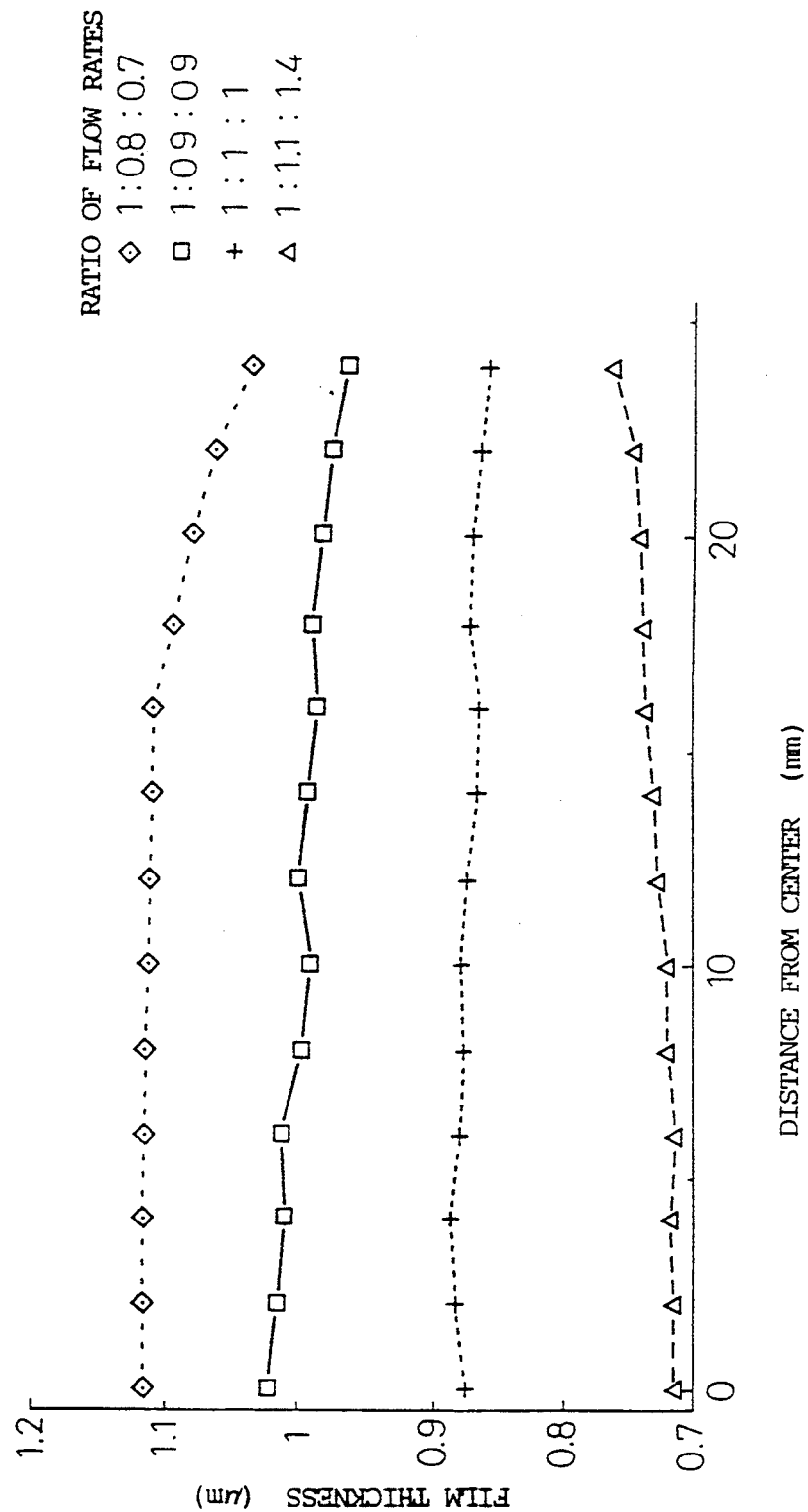
FIG. 18 is a graph showing film thickness distributions of InGaAsP layers deposited on a 2 inch InP substrate in the invention.

FIG. 18 is a graph showing distributions of the film thickness of InGaAsP layers deposited on 2 inch InP substrates according to the invention. The abscissa axis is the distance from the center of a substrate, and the ordinate axis is the deposited film thickness. Four lines in the drawing show the ratio [a, b, c] of the deposition gas flow rates supplied to each of the sub-injectors 11 in the respective groups a, b, and c, the ratios being [1: 0.8: 0.7], [1 : 0.9 : 0.9], [1 : 1: 1], and [1 : 1.1 : 1.4] from the uppermost line.

As shown in this drawing, when the flow rate in the radial direction was made approximately even by making the flow rate ratio of [1 : 1 : 1], the greatest uniformity of the film thickness was obtained.

Figure 19:
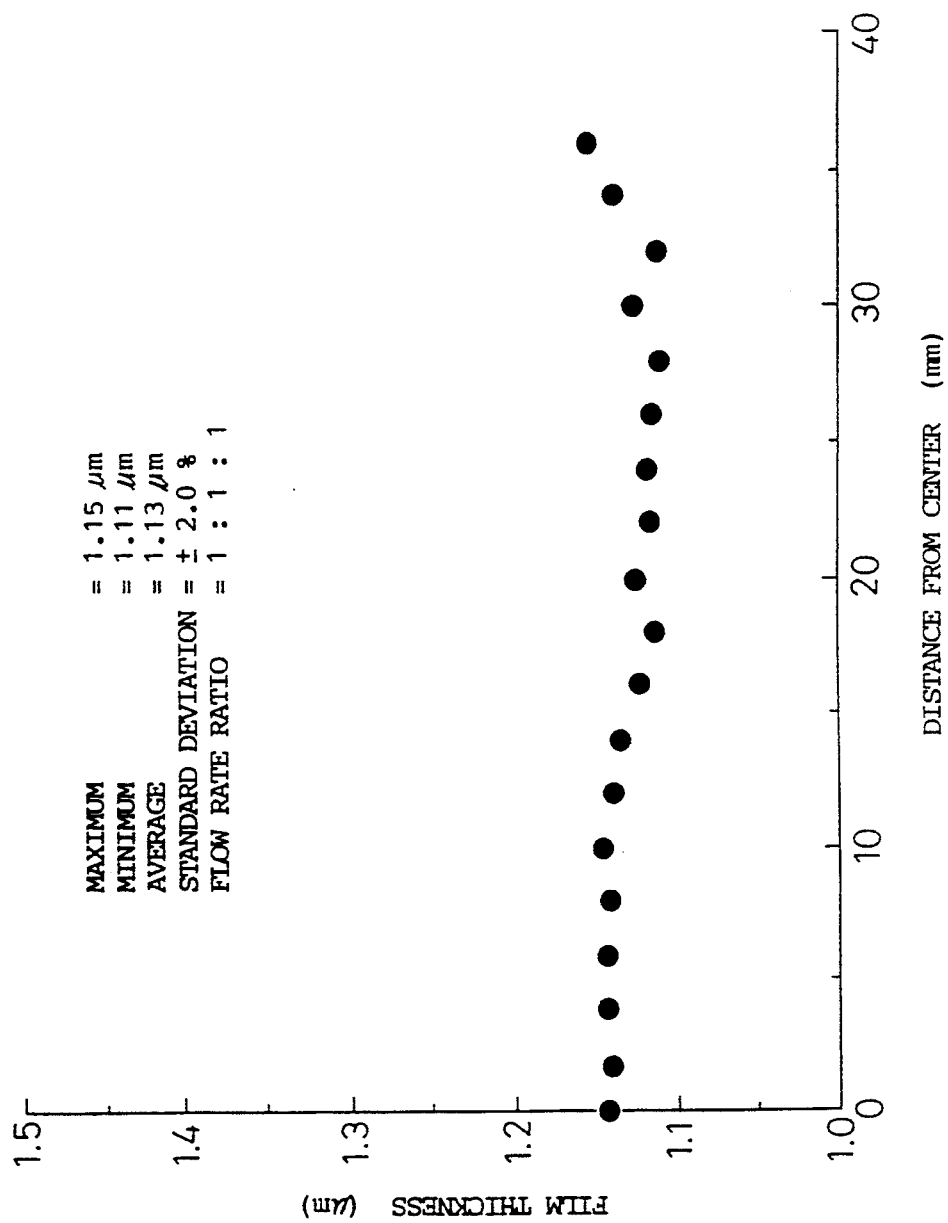
FIG. 19 is a graph showing a film thickness distribution of an InGaAsP layer deposited on a 3 inch InP substrate in the invention.

FIG. 19 is a graph showing a distribution of a film thickness of an InGaAsP layer deposited on a 3 inch InP substrate according to the invention, in which the ordinate and abscissa axes are the same as in FIG. 18. In this case, the flow rate ratio [a, b, c] of the deposition gas supplied to the sub-injectors was [1 : 1 : 1].

In this condition, a deposited film having a thickness of a maximum of 1.5 micrometers, a minimum of 1.11 micrometers, and an average of 1.13 micrometers was obtained. The standard deviation is ±2.0 percent. Considering that this value was +10–15 percent in prior vertical furnaces using a single gas injector, it is considered that uniformity of film thickness has been largely improved. In this connection, in the vertical furnace using the flow rate control technique described in Japanese Unexamined Patent Publication No. 1-140712 previously disclosed by the inventors, the standard deviation in a deposited film thickness was on the order of ±3 percent.

Figure 20:
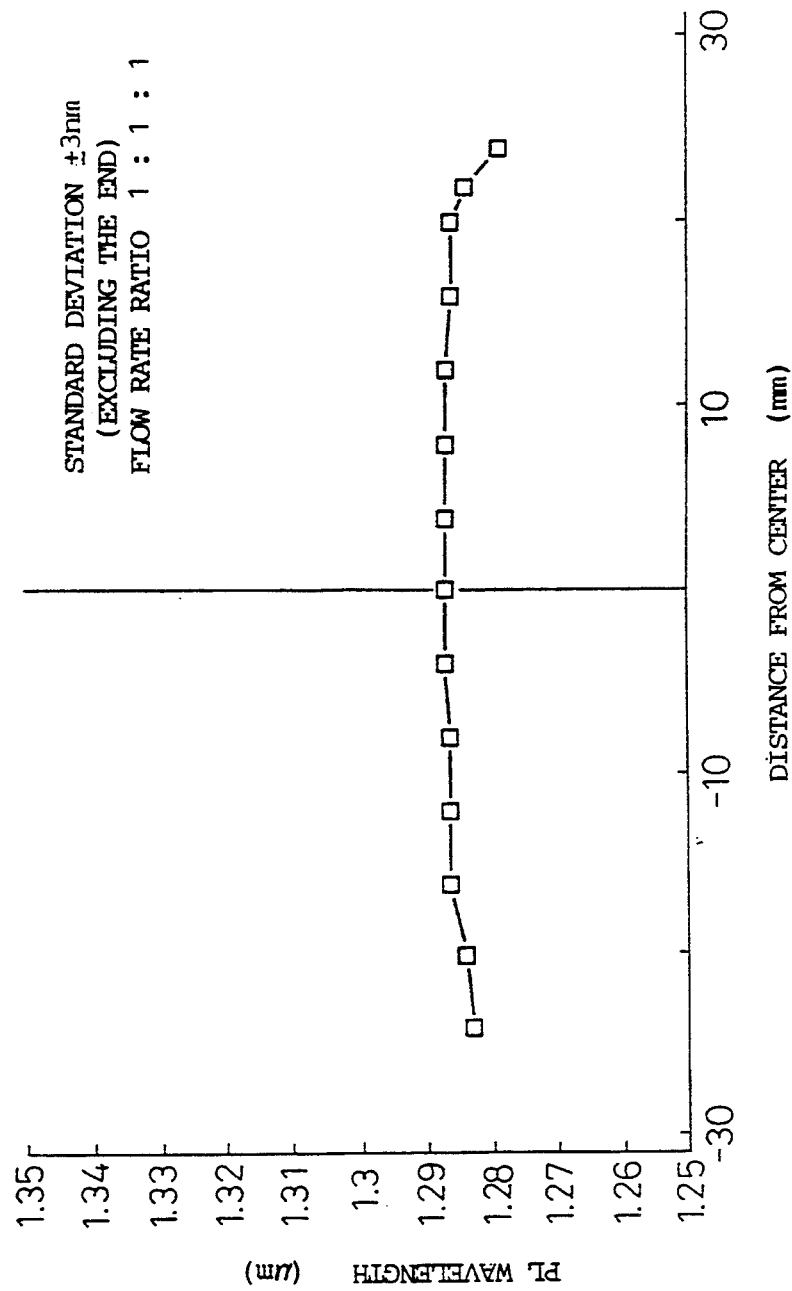
FIG. 20 is a graph showing a composition distribution of an InGaAsP layer deposited on a 2 inch InP substrate in the invention.

FIG. 20 is a graph showing a distribution of composition in an InGaAsP layer deposited on a 2 inch InP substrate according to the invention. In this drawing, the abscissa axis is the distance from the center of the substrate, and the ordinate axis is the PL wavelength of the deposited InGaAsP crystal.

Figure 21:
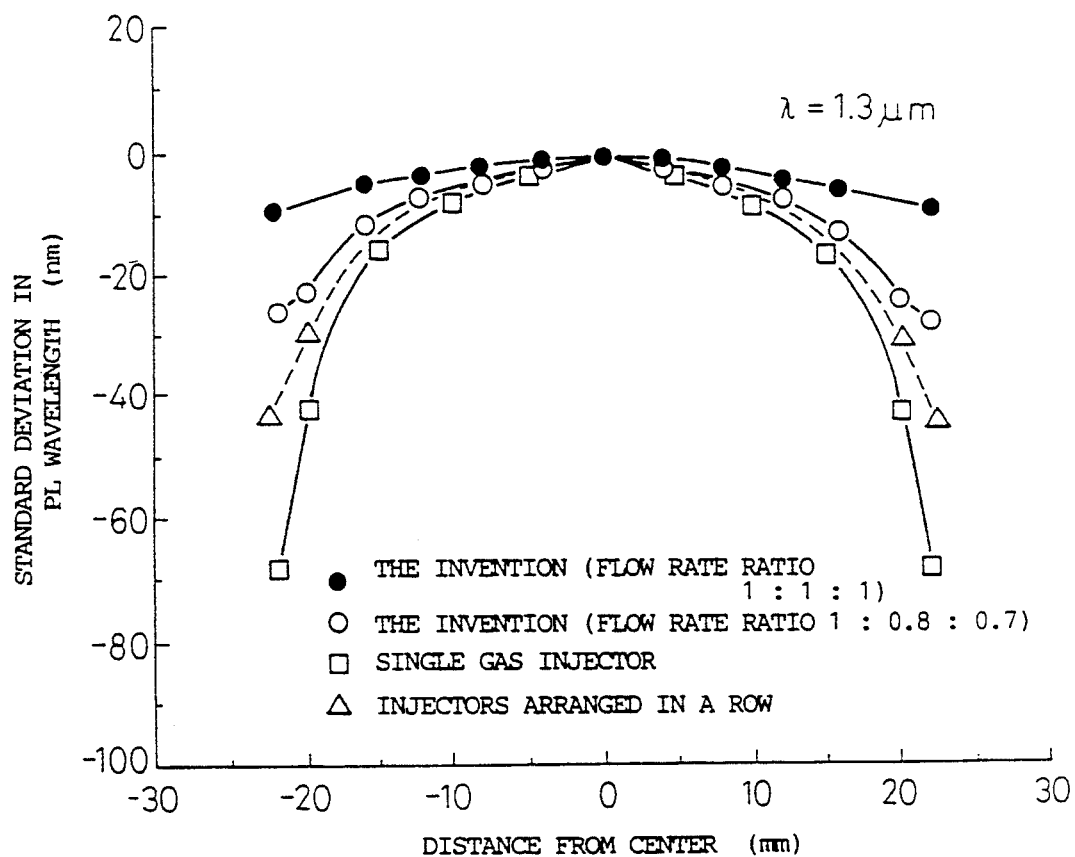
FIG. 21 is a graph showing standard deviation data of PL wavelength of InGaAsP layers deposited on 2 inch InP substrates according to the invention in comparison with those deposited according to a prior art.

FIG. 21 is a graph showing distributions in standard deviation of PL wavelength of InGaAsP crystals deposited on 2 inch InP substrates by using flow ratios [a, b, c] of [1 : 1 : 1] and [1 : 0.8 : 0.7] according to the present invention, in comparison with those of an InGaAsP crystal deposited in a conventional vertical furnace using a single gas injector and an InGaAsP crystal deposited by supplying a deposition gas from sub-injectors arranged in a row using the flow rate control technique described in Japanese Unexamined Patent Publication No. 1-140712. The standard deviation in PL wavelength was ±3.0 nanometers (excluding the edge of the substrate) in the case of the flow rate ratio [a, b, c] of [1 : 1 : 1] according to the invention, whereas the standard deviations in PL wavelength were on the order of ±10 nanometers, excluding the edge of a substrate, both in the case of the conventional vertical furnace using a single gas injector and in the case of the gas flows having controlled flow rates and supplied from sub-injectors arranged in a row.

From the above results, it is found that, with the crystals of quaternary compound semiconductor deposited according to the invention, the uniformity is largely improved in both the film thickness and the composition ratio, in comparison with those deposited in prior vertical furnaces, and particularly, the uniformity in composition ratio is largely improved even in comparison with the case of supplying deposition gas flows having controlled flow rates from sub-injectors arranged only in a row and not covering the entire surface of a substrate.

Of course, although the method and apparatus of the present invention are thus particularly useful for the deposition of a crystal of a quaternary compound semiconductor such as InGaAsP and AlGaInP, they also may be advantageously applied to the deposition of a crystal of a binary or ternary compound semiconductor.

Figure 22:
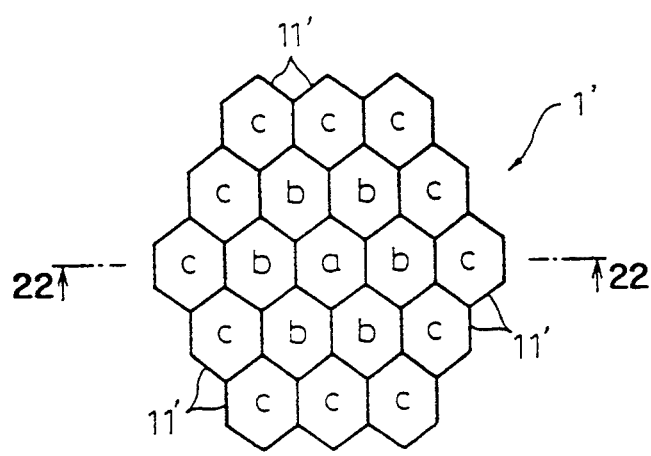
FIG. 22 is an illustration of a gas injector composed of regular-hexagonal sub-injectors.

Another embodiment of the gas injector in the invention will now be described. A gas injector 1' shown in FIG. 22 is formed by disposing 19 regular hexagon sub-injectors 11' in the form of a honeycomb, in such a manner that no gaps are spatially formed. In the same way as for the circular sub-injectors 11 illustrated in FIG. 13, these sub-injectors 11' also form the center sub-injector designated a, the group of intermediate sub-injectors designated b, and the group of end sub-injectors designated c.

The length of a side of the regular hexagon of the sub-injectors 11' may be on the order of about 7 millimeters in the case of a 2 inch substrate, and on the order of about 10 millimeters in the case of a 3 inch substrate; and if the total of 19 sub-injectors are disposed as in the drawing, the outer diameter of the entire gas injector 1' is about 60 millimeters in the former case, and about 90 millimeters in the latter case. The length from the inlet to the outlet of the gas injector 1' may be about 150 millimeters, for example.

In the gas injectors formed by disposing 19 regular hexagon sub-injectors as in FIG. 22, the areas of the residence portions (the non-flow portions) of gas in a vertical flowing region of the deposition gas supplied to a substrate are controlled on the order of about 10 percent of the vertical flowing region, assuming that the thickness of the sub-injector is 1 millimeter, for example. In contrast, with the gas injectors formed by arranging 19 circular sub-injectors having an outer diameter of 14 millimeters as in FIG. 13, the residence portions of gas in a vertical flowing region reach about 46 percent of the total area of the vertical flowing region, assuming that the thickness of the sub-injector is also 1 millimeter. Since the gas in the residence portion does not flow, the larger the rate of the residence portion, the more disadvantageous this is to the quick switching of a deposition gas, as when forming a heterojunction. Therefore, particularly in such a case, an advantageous gas injector is formed by arranging sub-injectors in such a manner that no gaps are spatially produced, as shown in FIG. 22.

Figure 23:
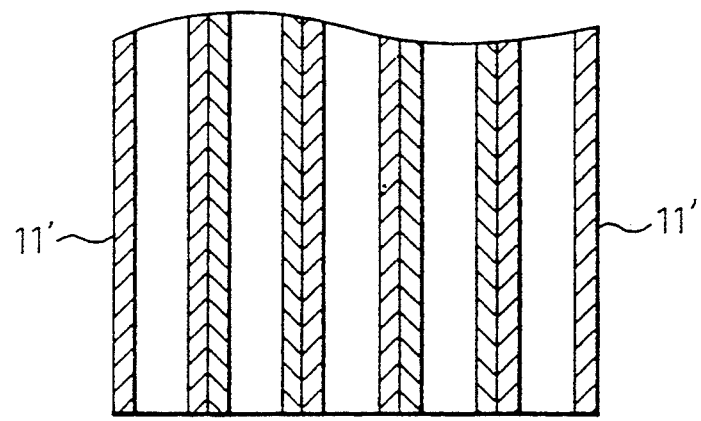
FIG. 23 is a cross section taken along the line B—B' in FIG. 22.
Figure 24:
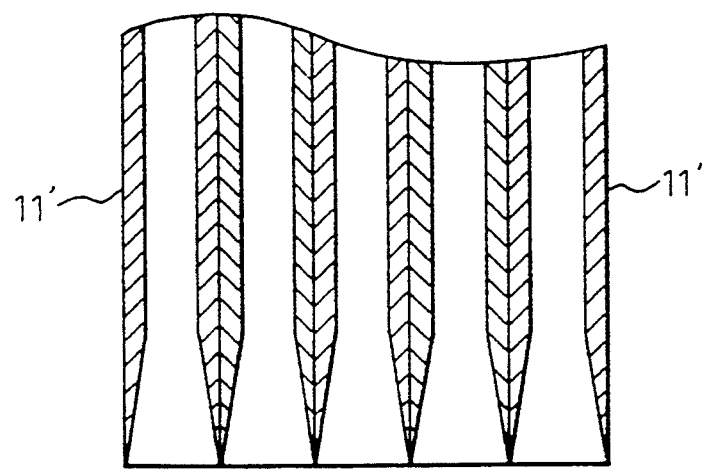
FIG. 24 is a cross section showing sub-injectors, the tube walls at the end portion of which have been obliquely whittled.

FIG. 23 shows the portion of the section of the gas injector in FIG. 22 taken along the line B—B', on the side of a reaction chamber. Even when regular hexagon sub-injectors are bundled in the form of a honeycomb, a residence portion of gas corresponding to at least the thickness of the sub-injectors 11' is still produced. To eliminate this, it is advantageous to extend the openings of the sub-injectors 11' by obliquely removing the tube walls at the end portion, as shown in FIG. 24. In this way, the wall thickness at the bottom face of the gas injector facing a substrate can be made as thin as possible, to thereby minimize the residence portion.

We claim:

1. A method of depositing a crystal of a compound semiconductor on a substrate having a main surface and positioned in a horizontal plane within a reaction chamber, a deposition gas comprising a mixture of at least two material gases being supplied to the reaction chamber and the material gases being pyrolyzed therein, thereby to deposit the compound semiconductor crystal on the substrate main surface, the method comprising:

providing a plurality of jet ports within the reaction chamber;

supplying the deposition gas in a plurality of gas streams;

individually controlling the respective flow rates of the plurality of gas streams;

dividing selected ones of the plurality of gas streams into divided gas streams; and supplying each non-selected gas stream and each selected and divided gas stream to a respective, individual jet port for forming a corresponding plurality of gas jets within the reaction chamber and which are directed vertically onto, and substantially uniformly cover, the main surface of the substrate on which the crystal is to be deposited.

2. A method of depositing a crystal of a compound semiconductor on a substrate having a main surface and positioned in a horizontal plane within a reaction chamber, a deposition gas comprising a mixture of at least two material gases being supplied to the reaction chamber and the material gases being pyrolyzed therein, thereby to deposit the compound semiconductor crystal on the substrate main surface, the method comprising:

defining, on the main surface of the substrate, a central area, a group of plural, intermediate areas contiguous to each other and contiguous to and surrounding the central area, and a group of outer areas, contiguous to each other and contiguous to and surrounding the intermediate areas;

disposing a plurality of jet ports within the reaction chamber in accordance with the defined areas of the main surface of the substrate and so as to include a central jet port, a group of plural, intermediate jet ports surrounding the central jet port and a group of outer jet ports surrounding the intermediate jet ports;

supplying the deposition gas in a plurality of gas streams corresponding to the plurality of jet ports;

individually controlling the respective flow rates of the plurality of gas streams;

supplying the plurality of gas streams to the plurality of jet ports for correspondingly producing a central gas jet, a group of intermediate gas jets surrounding the central gas jet and a group of outer gas jets surrounding the intermediate gas jets and which are directed vertically onto, and substantially uniformly cover, the main surface of the substrate on which the crystal is to be deposited; and individually controlling the respective flow rates of the plurality of gas streams to be a common flow rate value.

3. A method of depositing a crystal of a compound semiconductor on a substrate having a main surface and positioned in a horizontal plane within a reaction chamber, a deposition gas comprising a mixture of at least two material gases being supplied to the reaction chamber and the material gases being pyrolyzed therein, thereby to deposit the compound semiconductor crystal on the substrate main surface, the method comprising:

selecting the respective compositions of the at least two material gases, the mixture thereof comprising the deposition gas, for depositing a crystal of a III—V compound semiconductor on the substrate;

supplying the deposition gas in a plurality of gas streams;

individually controlling the respective flow rates of the plurality of gas streams; and forming the plurality of gas streams, having individually adjusted flow rates, so as to produce a corresponding plurality of gas jets within the reaction chamber and which are directed vertically onto, and substantially uniformly cover, the main surface of the substrate on which the crystal is to be deposited.

4. The method as recited in claim 3, further comprising selecting the respective compositions of the at least two material gases of the mixture for depositing a III—V compound semiconductor of InGaAsP.

5. The method as recited in claim 4, further comprising:
   selecting the respective compositions of the at least two material gases of the mixture to include the elements trimethylindium, triethylgallium, arsine, and phosphine, for depositing the III—V compound semiconductor of InGaAsP.

6. The method as recited in claim 3, further comprising:
   selecting the respective compositions of the at least two material gases of the mixture for depositing a III-V compound semiconductor of AlGaInP.

7. The method as recited in claim 6, further comprising:
   selecting the respective compositions of the at least two material gases of the mixture to include the elements trimethylindium, triethylgallium, arsine and phosphine, for depositing a III—V compound semiconductor of AlGaInP.

8. The method as recited in claim 1, further comprising selecting the respective compositions of the at least two material gases of the mixture for depositing a III-V compound semiconductor of InGaAsP.

9. The method as recited in claim 8, further comprising:
   selecting the respective compositions of the at least two material gases of the mixture to include the elements trimethylindium, triethylgallium, arsine, and phosphine, for depositing the III—V compound semiconductor of InGaAsP.

10. The method as recited in claim 1, further comprising:
    selecting the respective compositions of the at least two material gases of the mixture for depositing a III-V compound semiconductor of AlGaInP.

11. The method as recited in claim 10, further comprising:
    selecting the respective compositions of the at least two material gases of the mixture to include the elements trimethylindium, triethylgallium, arsine and phosphine, for depositing a III—V compound semiconductor of AlGaInP.

12. The method as recited in claim 2, further comprising selecting the respective compositions of the at least two material gases of the mixture for depositing a III—V compound semiconductor of InGaAsP.

13. The method as recited in claim 12, further comprising:
    selecting the respective compositions of the at least two material gases of the mixture to include the elements trimethylindium, triethylgallium, arsine, and phosphine, for depositing the III—V compound semiconductor of InGaAsP.

14. The method as recited in claim 2, further comprising:
    selecting the respective compositions of the at least two material gases of the mixture for depositing a III—V compound semiconductor of AlGaInP.

15. The method as recited in claim 12, further comprising:
    selecting the respective compositions of the at least two material gases of the mixture to include the elements trimethylindium, triethylgallium, arsine and phosphine, for depositing a III—V compound semiconductor of AlGaInP.

* * * * *

UNITED STATES PATENT AND TRADEMARK OFFICE
CERTIFICATE OF CORRECTION

PATENT NO. : 5,392,730
DATED : February 28, 1995
INVENTOR(S) : Kondo et al.

It is certified that error appears in the above-identified patent and that said Letters Patent is hereby corrected as shown below:

On the title page, item [56] under Reference cited under "FOREIGN PATENT DOCUMENTS"

" 1-40712 " should be --1-140712--.

Signed and Sealed this

Twenty-ninth Day of August, 1995

Attest:

BRUCE LEHMAN

*Attesting Officer*  *Commissioner of Patents and Trademarks*